United States Patent
Kim et al.

(10) Patent No.: US 11,702,537 B2
(45) Date of Patent: Jul. 18, 2023

(54) TABLET-TYPE EPOXY RESIN COMPOSITION FOR SEALING SEMICONDUCTOR DEVICE, AND SEMICONDUCTOR DEVICE SEALED USING THE SAME

(71) Applicant: SAMSUNG SDI CO., LTD., Yongin-si (KR)

(72) Inventors: Sang Jin Kim, Suwon-si (KR); Sang Kyun Kim, Suwon-si (KR); Tae Shin Eom, Suwon-si (KR); Dong Hwan Lee, Suwon-si (KR); Young Joon Lee, Suwon-si (KR); Yong Han Cho, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 761 days.

(21) Appl. No.: 16/722,670

(22) Filed: Dec. 20, 2019

(65) Prior Publication Data

US 2020/0140677 A1    May 7, 2020

Related U.S. Application Data

(63) Continuation of application No. PCT/KR2018/005509, filed on May 14, 2018.

(30) Foreign Application Priority Data

Jun. 21, 2017   (KR) .................. 10-2017-0078798

(51) Int. Cl.
   *C08L 63/00*        (2006.01)
   *B29C 43/00*        (2006.01)
   (Continued)

(52) U.S. Cl.
   CPC ............ *C08L 63/00* (2013.01); *B29C 43/003* (2013.01); *B29C 43/10* (2013.01); *H01L 23/295* (2013.01);
   (Continued)

(58) Field of Classification Search
   CPC .... C08L 63/00; C08L 2310/00; B29C 43/003; B29C 43/10; B29C 2043/106;
   (Continued)

(56) References Cited

U.S. PATENT DOCUMENTS

2011/0241188 A1* 10/2011 Mizuno ................. H01L 21/565
                                                                            523/400

FOREIGN PATENT DOCUMENTS

JP    2007-194425 A    8/2007
JP    2009-188142 A    8/2009
(Continued)

OTHER PUBLICATIONS

U.S. Appl. No. 16/719,046, filed 2019.*
(Continued)

*Primary Examiner* — Ling Siu Choi
*Assistant Examiner* — Ronald Grinsted
(74) *Attorney, Agent, or Firm* — Lee IP Law, P.C.

(57) ABSTRACT

A tablet form of an epoxy resin composition for encapsulation of semiconductor elements, where the tablet form of the epoxy resin composition: (i) includes 97 wt % or more of tablets having a diameter of 0.1 mm to less than 2.8 mm and a height of 0.1 mm to less than 2.8 mm, as measured using an ASTM standard sieve; (ii) satisfies the following Equation 1, $$\frac{\sigma D \times \sigma H}{\sigma D + \sigma H} \leq 1.0,$$

(Continued)

where σD is a standard deviation of tablet diameters and σH is a standard deviation of tablet heights, as measured with respect to 50 tablets arbitrarily selected from the tablets; and (iii) the tablets have a compression density of 1.2 g/mL to 1.7 g/mL.

11 Claims, 3 Drawing Sheets

(51) Int. Cl.
  *B29C 43/10* (2006.01)
  *H01L 23/29* (2006.01)
  *C08K 3/013* (2018.01)
  *B29K 463/00* (2006.01)
  *C08K 5/00* (2006.01)

(52) U.S. Cl.
  CPC .... *B29C 2043/106* (2013.01); *B29K 2463/00* (2013.01); *C08K 3/013* (2018.01); *C08K 5/0025* (2013.01); *C08L 2310/00* (2013.01)

(58) Field of Classification Search
  CPC ..... H01L 23/295; C08K 3/013; C08K 5/0025; B29K 2463/00
  USPC .......................................................... 264/120
  See application file for complete search history.

(56) References Cited

FOREIGN PATENT DOCUMENTS

| KR | 10-2005-0009234 A | 1/2005 |
| KR | 10-2011-0104507 A | 9/2011 |
| KR | 10-2016-0117316 A | 10/2016 |
| TW | 200417576 A | 9/2004 |
| TW | 201033279 A | 9/2010 |

OTHER PUBLICATIONS

Taiwanese Office Action dated Feb. 27, 2020.
Provisional double patenting rejection over claims of the above-identified application; USPTO Office action dated June 9, 2022, in U.S. Appl. No. 16/719,046.
International Search Report dated Aug. 24, 2018 for PCT/KR2018/005509.

* cited by examiner (a)

(b)

TABLET-TYPE EPOXY RESIN COMPOSITION FOR SEALING SEMICONDUCTOR DEVICE, AND SEMICONDUCTOR DEVICE SEALED USING THE SAME

CROSS-REFERENCE TO RELATED APPLICATIONS

This application is a continuation of pending International Application No. PCT/KR2018/005509 filed on May 14, 2018, which claims priority of Korean Patent Application No. 10-2017-0078798 filed on Jun. 21, 2017, in the Korean Intellectual Property Office, each which is entitled: "Tablet-Type Epoxy Resin Composition for Sealing Semiconductor Device, and Semiconductor Device Sealed Using the Same," each of which is incorporated by reference herein in its entirety.

BACKGROUND

1. Field

Embodiments relate to a tablet form of an epoxy resin composition for encapsulation of semiconductor elements and a semiconductor device encapsulated using the same.

2. Description of the Related Art

As the electronic device market has shifted to mobile devices represented by smartphones and tablets, technology development for electronic devices has focused on smaller, lighter and higher performance mobile devices.

SUMMARY

Embodiments are directed to a tablet form of an epoxy resin composition for encapsulation of semiconductor elements. The tablet form of the epoxy resin composition may: (i) include 97 wt % or more of tablets having a diameter of 0.1 mm to less than 2.8 mm and a height of 0.1 mm to less than 2.8 mm, as measured using an ASTM standard sieve; (ii) satisfy the following Equation 1, $$\frac{\sigma D \times \sigma H}{\sigma D + \sigma H} \leq 1.0,$$

where $\sigma D$ is a standard deviation of tablet diameters and $\sigma H$ is a standard deviation of tablet heights, as measured with respect to 50 tablets arbitrarily selected from the tablets; and (iii) have a compression density for the tablets of 1.2 g/mL to 1.7 g/mL.

Embodiments are also directed to a method of preparing a tableted epoxy resin composition, the method including providing an epoxy resin master batch that includes 0.5 wt % to 20 wt % of an epoxy resin, 0.1 wt % to 13 wt % of a curing agent, 70 wt % to 95 wt % of an inorganic filler, and 0.01 wt % to 2 wt % of a curing accelerator, all wt % being based on a total weight of the master batch; preparing a powder composition from the master batch; and tableting the powder composition by compressing the powder composition in a die using a compression load in a range of 0.1 ton to 1.0 ton, the die having a diameter of 0.1 mm to less than 2.8 mm and a height of 0.1 mm to less than 2.8 mm.

Embodiments are also directed to a semiconductor device encapsulated using the tablet form of the epoxy resin composition for encapsulation of semiconductor elements.

BRIEF DESCRIPTION OF THE DRAWINGS

Features will become apparent to those of skill in the art by describing in detail example embodiments with reference to the attached drawings in which.

DETAILED DESCRIPTION

Figure 1:
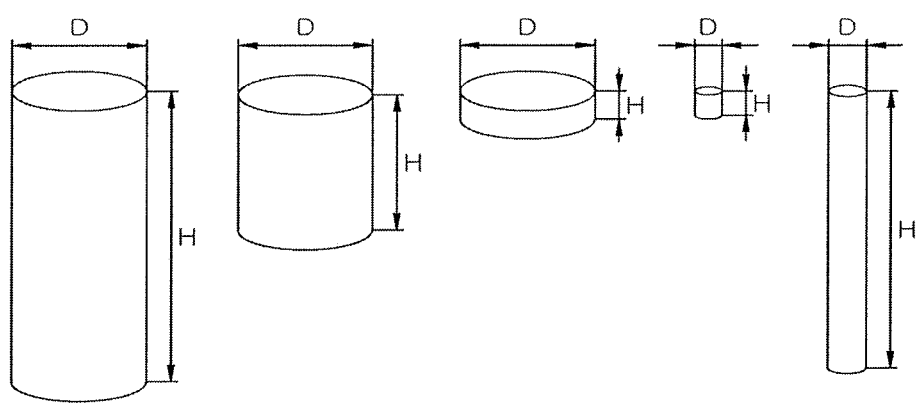
FIG. 1 is a diagram illustrating shapes and dimensions of tablets according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

Herein, the term "tablet" or derivatives thereof mean a shape including a first surface, a second surface, and a side surface connecting the first surface to the second surface, in which the first surface is disposed to face the second surface. In an example embodiment, each of the first and second surfaces is a flat surface and the side face is one rounded surface. In an example embodiment, the tablets may have a cylindrical shape.

FIG. 1 is a diagram illustrating shapes and dimensions of tablets according to example embodiments.

Referring to FIG. 1, the tablets may have a cylindrical shape, which may have a diameter D on the first surface (or second surface) and a height H on the side surface. According to example embodiments, the "tablets" may include tablets in which the diameter D is the same as the height H and tablets in which the diameter D is greater than the height H.

Herein, the "aspect ratio" of the tablets may be a ratio (height H/diameter D) of height H to diameter D thereof.

Herein, the "tablet form of an epoxy resin composition for encapsulation of semiconductor elements" may mean an epoxy resin composition for encapsulation of semiconductor elements, which includes 98 wt % or more of tablets, for example, 99 wt % or more, based on the total amount of the tablet form of the epoxy resin composition.

Herein, the "compression density" is a value measured with respect to tablets having a sieve size of 0.1 mm to less than 2.8 mm upon sieving with an ASTM standard sieve. Some of the tablets having a sieve size of 0.1 mm to less than 2.8 mm are weighed to obtain a specimen and the weight W of the specimen is measured using an electronic scale. With half of a 50 ml-graduated cylinder filled with water, a silicone-based surfactant is added to the cylinder, followed by accurately measuring a volume V1 of the water in the cylinder. The weighed tablets are placed in the cylinder, followed by accurately measuring a changed volume V2 of the water in the cylinder. Then, a compression density (unit: g/mL) is calculated according to Equation 2. Here, in order to remove air from a space between the tablets, the volume is measured after shaking the graduated cylinder and the compression density was measured five times and averaged.

Compression density=$W/(V2-V1)$ <Equation 2>

Herein, the standard deviation of diameters σD means a value obtained by a statistical equation, for example, $$\sigma D = \sqrt{\frac{(x_1-m)^2 + (x_2-m)^2 + \ldots + (x_n-m)^2}{n}},$$

wherein:
m=average value:

$$m = \frac{x_1 + x_2 + \ldots + x_n}{n},$$

$x_i$=the diameter of an $i^{th}$ tablet among 50 tablets,
i is an integer from 1 to 50, and
n=50,
as obtained from the diameters of 50 tablets arbitrarily selected from tablets of an epoxy resin composition for encapsulation of semiconductor elements.

Herein, the standard deviation of heights σH means a value obtained by a statistical equation, for example, $$\sigma H = \sqrt{\frac{(x_1-m)^2 + (x_2-m)^2 + \ldots + (x_n-m)^2}{n}},$$

wherein:
m=average value:

$$m = \frac{x_1 + x_2 + \ldots + x_n}{n},$$

$x_i$=the height of an $i^{th}$ tablet among 50 tablets,
i is an integer from 1 to 50, and
n=50,
as obtained from the heights of 50 tablets arbitrarily selected from tablets of the epoxy resin composition for encapsulation of semiconductor elements.

Herein, the "curing density" may be calculated by a ratio of mass to volume (mass/volume), in which the mass and the volume are values measured with respect to a disc, which has a size of 50 mm×3 mm (diameter×thickness) and is formed of an epoxy resin composition for encapsulation of semiconductor elements through transfer molding under conditions of a mold temperature of 175±5° C., an injection pressure of 7 MPa and a curing time of 120 seconds, followed by PMC (post-mold curing) in an oven at 175° C. for 4 hours.

A tablet form of an epoxy resin composition for encapsulation of semiconductor elements according to an example embodiment satisfies all of the following conditions (i), (ii), and (iii):

(i) the tablet form of the epoxy resin composition includes 97 wt % or more of tablets having a diameter of 0.1 mm to less than 2.8 mm and a height of 0.1 mm to less than 2.8 mm, as measured using an ASTM standard sieve;

(ii) satisfies the following Equation 1:

$$\frac{\sigma D \times \sigma H}{\sigma D + \sigma H} \leq 1.0 \qquad (1)$$

where σD is a standard deviation of tablet diameters and σH is a standard deviation of tablet heights, as measured with respect to 50 tablets arbitrarily selected from the tablets; and (iii) the tablets have a compression density of 1.2 g/mL to 1.7 g/mL.

By satisfying all of conditions (i), (ii), and (iii), the tablet form of the epoxy resin composition may provide reduced thickness deviation of a semiconductor package upon encapsulation of semiconductor elements, and may thus reduce warpage deviation of a semiconductor device and improve process yield. In addition, the tablet form of the epoxy resin composition may suppress contamination of equipment such as a vibration feeder due to scattering of fine powder, and may significantly reduce wire sweep during compression molding of the semiconductor element.

In the tablet form of the epoxy resin composition for encapsulation of semiconductor elements according to an example embodiment, tablets having a diameter of 0.1 mm to less than 2.8 mm and a height of 0.1 mm to less than 2.8 mm, as measured using an ASTM standard sieve, are present in an amount of 97 wt % or more based on the total amount of the tablet faun of the epoxy resin composition. By maintaining the amount of tablets having a diameter or height of less than 0.1 mm at less than 3 wt %, the amount of fine powder may be controlled, which may thus avoid contamination of the compression molding equipment from sticking of fine powder to the compression molding equipment. By maintaining the amount of tablets having a diameter or height of 2.8 mm or more at less than 3 wt %, breakage of the tablets may be avoided during transfer of the tablet form of the epoxy resin composition, which may thus avoid contamination of the compression molding equipment, and maintain the shape of the tablets. Thus, measurement failure in the compression molding equipment may be avoided, and a thickness difference of a semiconductor package and defects due to warpage deviation may be avoided.

In sieving with the ASTM standard sieve, the sieve size of 0.1 mm corresponds to ASTM mesh No. 140 and the sieve size of 2.8 mm corresponds to ASTM mesh No. 7.

In addition, (ii) the tablet form of the epoxy resin composition according to an example embodiment may satisfy Equation 1, where σD is the standard deviation of tablet diameters and σH is the standard deviation of tablet heights, as measured with respect to 50 tablets arbitrarily selected from the tablets of the epoxy resin composition. By satisfying Equation 1, the tablet form of the epoxy resin composition according to an example embodiment may reduce thickness deviation of a semiconductor package and semiconductor warpage deviation upon compression molding. A tablet form of the epoxy resin composition prepared through a centrifugal milling method or a hot cut method in the art does not satisfy condition (ii) and thus does not reduce thickness deviation of the semiconductor package and warpage deviation as in the present example embodiment.

In an example embodiment, each of σD and σH is 2.0 or less, for example 1.5 or less. Within this range, the resin composition may significantly reduce molding thickness deviation and semiconductor warpage deviation while significantly reducing wire sweep.

In an example embodiment, each of σD and σH may be less than 1.0. Within this range, the tablet form of the epoxy resin composition satisfies Equation 1, and the tablet form of the epoxy resin composition may significantly reduce molding thickness deviation and semiconductor warpage deviation while significantly reducing wire sweep. In an example embodiment, each of σD and σH is in a range of 0.1 to less than 1.0.

In the tablet form of the epoxy resin composition for encapsulation of semiconductor elements according to an example embodiment, the tablets may have a compression density of 1.2 g/mL to 1.7 g/mL. By maintaining the compression density of the tablets to be 1.2 g/mL or more, breakage of the tablets during transfer of the tablet form of the epoxy resin composition may be avoided, which may avoid causing contamination of the compression molding equipment and avoid deterioration in process yield. By maintaining the compression density of the tablets to be 1.7 g/mL or less, the density of the tablets may be controlled from being too high and the tablets may be sufficiently melted by a heater provided to a lower molding cavity upon compression molding, thereby helping to avoid a wire sweep defect. In addition, thickness deviation of a semiconductor package may be limited, thus helping to avoid poor semiconductor warpage characteristics. The compression density may be measured by the method described above.

In an example embodiment, the tablet form of the epoxy resin composition may have a density ratio of compression density to curing density (compression density/curing density) in the range of 0.6 to 0.87. For example, the tablet form of the epoxy resin composition may have a density ratio in the range of 0.6 to 0.8. Within this range, the tablet form of the epoxy resin composition may exhibit good melting properties and compatibility upon compression molding while suppressing generation of wire sweep and voids.

In an example embodiment, the tablet form of the epoxy resin composition may have a curing density of 1.95 g/mL to 2.00 g/mL, for example 1.96 g/mL to 1.99 g/mL.

In the tablet form of the epoxy resin composition according to an example embodiment, the tablets may have an aspect ratio of 0.1 to 5.0, for example, 0.1 to 3.0. Within this range, the tablet form of the epoxy resin composition may reduce thickness deviation of a semiconductor package, thereby reducing warpage deviation.

The tablet form of the epoxy resin composition according to an example embodiment may be prepared by a tablet compression molding method described below.

The tablet compression molding method may be performed using a tablet compression molding machine. For example, the epoxy resin composition is melt-kneaded at 90° C. to 110° C. using a continuous kneader, followed by cooling and pulverization, thereby preparing a powder composition. The prepared powder composition may be poured into a feeder of a tableting machine. Then, the powder composition placed in a die may be compressed by lowering an upper punch to prepare a tablet form of the composition, which in turn may be ejected from the die by lifting the upper punch. As such, the tablet form of the epoxy resin composition for encapsulation of semiconductor elements may prepared by adjusting compression load applied to the composition by lowering the upper punch and lifting a lower punch, the diameter and height of the die, and the like. In an example embodiment, the compression load may be changed depending upon the diameter of the die, the height of the die, the pouring height and diameter of the composition poured into the die, and the like, and may be in the range of 0.1 ton to 1.0 ton. In an example embodiment, the die may have a diameter of 0.1 mm to less than 2.8 mm and a height of 0.1 mm to less than 2.8 mm.

In a general milling method using centrifugal milling to mold a tablet form of an epoxy resin composition for encapsulation of semiconductor elements, since the epoxy resin composition is allowed to pass through a uniform punching iron screen in a melt-kneaded state by centrifugal force of a rotor, the epoxy resin composition cannot satisfy Equation 1, thereby resulting in a large thickness deviation upon molding. In addition, since molding is performed in the melt-kneaded state of the composition, the epoxy resin composition has a higher compression density than the epoxy resin composition according to an example embodiment and thus is not sufficiently melted upon compression molding, thereby causing a wire sweep defect and poor semiconductor warpage characteristics due to severe molding thickness deviation.

In a general method using a hot-cut method for molding a tablet form of an epoxy resin composition for encapsulation of semiconductor elements, since the epoxy resin composition is cut in a melt-kneaded state, the epoxy resin composition has a higher compression density than the epoxy resin composition according to an example embodiment and thus is not always sufficiently melted upon compression molding, thereby causing a wire sweep defect and poor semiconductor warpage characteristics due to severe molding thickness deviation. In addition, the hot-cut method preparation of the epoxy resin composition cannot satisfy conditions (i) and (ii) due to a limitation of the sliding rotational speed of the cutter, thereby causing poor semiconductor warpage characteristics due to severe molding thickness deviation.

Next, components of the tablet form of the epoxy resin composition for encapsulation of semiconductor elements according to an example embodiment will be described.

The tablet form of the epoxy resin composition for encapsulation of semiconductor elements according to an example embodiment may include an epoxy resin, a curing agent, a curing accelerator, and an inorganic filler.

The epoxy resin may be a mixture of a monomer, an oligomer and a polymer, which have two or more epoxy groups per molecule. For example, the epoxy resin may include one or more of bisphenol epoxy resins (such as bisphenol A epoxy resins and bisphenol F epoxy resins), phenol novolac epoxy resins, tert-butyl catechol epoxy resins, naphthalene epoxy resins, glycidyl amine epoxy resins, phenol aralkyl type epoxy resins, cresol novolac type epoxy resins, biphenyl type epoxy resins, linear aliphatic epoxy resins, heterocyclic epoxy resins, spirocyclic epoxy resins, cyclohexanedimethanol type epoxy resins, halogenated epoxy resins, biphenyl-type novolac epoxy resins, or combinations thereof.

The curing agent may be selected from curing agents capable of curing an epoxy resin. For example, the curing agent may include one or more of phenol aralkyl type phenol resins, phenol novolac type phenol resins, biphenyl type novolac phenol resins, xyloc type phenol resins, cresol novolac type phenol resins, naphthol type phenol resins, terpene type phenol resins, polyfunctional phenol resins, dicyclopentadiene phenol resins, novolac type phenol resins synthesized from bisphenol A and resoles, polyhydric phenol compounds such as tris(hydroxyphenyl) methane and dihydroxybiphenyl, acid anhydrides such as maleic anhydride and phthalic anhydride, or aromatic amines such as meta-phenylenediamine, diaminodiphenylmethane, and diaminodiphenylsulfone. The curing agent may be a phenol resin having at least one hydroxyl group.

The curing accelerator may be selected from curing accelerators capable of promoting curing reaction between an epoxy group of the epoxy resin and the curing agent. For example, the curing accelerator may include one more of tertiary amines, organometallic compounds, organophosphorus compounds, imidazole compounds, boron compounds, or the like. Examples of the tertiary amines may include benzyldimethylamine, triethanolamine, triethylenediamine, dimethylaminoethanol, tri(dimethylaminomethyl)phenol, 2-2-(dimethylaminomethyl)phenol, 2,4,6-tris(diaminomethyl)phenol, and salts of tri-2-ethylhexanoic acid. Examples of the organometallic compounds may include chromium acetylacetonate, zinc acetylacetonate, and nickel acetylacetonate. Examples of the organophosphorus compounds may include tris(4-methoxy)phosphine, phenylphosphine, triphenylborane, and triphenylphosphine-1,4-benzoquinone adducts. Examples of the imidazole compounds may include 2-methylimidazole, 2-phenylimidazole, 2-aminoimidazole, 2-methyl-1-vinylimidazole, 2-ethyl-4-methylimidazole, and 2-heptadecylimidazole. Examples of the boron compounds may include triphenylphosphine tetraphenylborate, tetraphenylboron salts, trifluoroborane-n-hexylamine, trifluoroborane monoethylamine, tetrafluoroborane triethylamine, and tetrafluoroborane amine. In addition, the curing accelerator may include 1,5-diazabicyclo[4.3.0]non-5-ene (DBN), 1,8-diazabicyclo[5.4.0]undec-7-ene (DBU), phenol novolac resin salts, and the like. The curing accelerator may be used in the form of adducts obtained by pre-reacting these compounds with the epoxy resin or the curing agent.

The inorganic filler may be selected from inorganic fillers suitable for use in an epoxy resin composition for encapsulation of semiconductor elements. For example, the inorganic filler may include one or more of fused silica, crystalline silica, calcium carbonate, magnesium carbonate, alumina, magnesia, clay, talc, calcium silicate, titanium oxide, antimony oxide, or glass fibers. For example, fused silica having a low coefficient of linear expansion may be used to reduce stress. Fused silica refers to amorphous silica having a true specific gravity of 2.3 or less. Fused silica may be produced by melting crystalline silica or may include amorphous silica prepared from various materials. In an example embodiment, the inorganic filler may include 40 wt % to 100 wt % of a fused silica mixture including 50 wt % to 99 wt % of spherical fused silica having an average tablet diameter of 5 μm to 30 μm and 1 wt % to 50 wt % of spherical fused silica having an average tablet diameter of 0.001 μm to 1 μm. In addition, the maximum tablet diameter of the fused silica may be adjusted to any one of about 45 μm, about 55 μm, or about 75 μm, depending upon desired use of the resin composition. The spherical fused silica may include conductive carbon as a foreign substance on a surface thereof, and, thus, a material having less polar foreign substances intruding thereinto may be selected.

The epoxy resin composition may further include one or more additives. In some example embodiments, the additives may include one or more of a coupling agent, a release agent, a stress relieving agent, a crosslinking promoter, a leveling agent, or a colorant. The coupling agent may include one or more of epoxysilane, aminosilane, mercaptosilane, alkylsilane, or alkoxysilane. The release agent may include one or more of paraffin wax, ester wax, higher fatty acids, metal salts of higher fatty acids, natural fatty acids, or natural fatty acid metal salts. The stress relieving agent may include one or more of modified silicone oil, silicone elastomers, silicone powder, or silicone resin. The colorant may include carbon black.

The epoxy resin composition may include 0.5 wt % to 20 wt % (for example, 3 wt % to 15 wt %) of the epoxy resin, 0.1 wt % to 13 wt % (for example, 0.1 wt % to 10 wt %) of the curing agent, 70 wt % to 95 wt % (for example, 75 wt % to 94 wt %) of the inorganic filler, and 0.01 wt % to 2 wt % (for example, 0.02 wt % to 1.5 wt %) of the curing accelerator, and may include, for example, 0.1 wt % to 10 wt % of other additives.

According to an example embodiment, a semiconductor device may be produced by encapsulation of semiconductor elements using the tablet form of the epoxy resin composition according to an example embodiment by compression molding.

The semiconductor elements may include one or more of an integrated circuit, a transistor, a thyristor, a diode, a solid-state imaging device, or the like.

The semiconductor device may be or include a ball grid array (BGA), an MAP type BGA, and the like. In example embodiments, the epoxy resin composition according to an example embodiment may also be used to produce a chip size package (CSP), a quad flat no-lead package (QFN), a small outline no-lead package (SON), a lead frame BGA, and the like.

Figure 2:
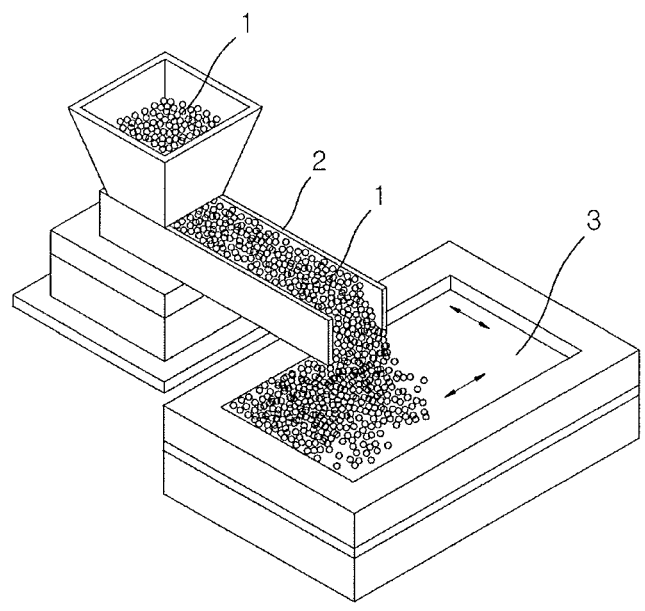
FIGS. 2(a) and (b) are diagrams illustrating an example of a method of encapsulating a semiconductor element by compression molding.
Figure 2:
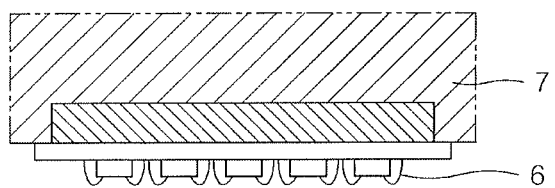
Figure 2:
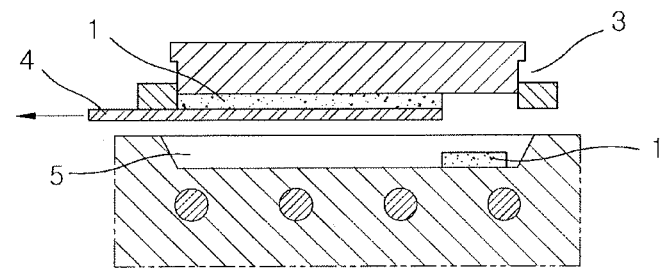

Referring to FIGS. 2(*a*) and (*b*), an encapsulation method using the tablet form of the epoxy resin composition for encapsulation of semiconductor elements by compression molding will be described.

In an example embodiment, referring to FIG. 2(*a*), an epoxy resin composition 1 for encapsulation of semiconductor elements according to an embodiment is supplied to a composition supply container 3 through a vibration feeder 2. The vibration feeder 2 is vibrated at a constant supply speed or at a variable supply speed to allow a predetermined amount of the tablet form of the epoxy resin composition to be supplied at a constant rate to the composition supply container 3.

Referring to FIG. 2(*b*), the composition supply container 3 is provided with a shutter 4 such that the epoxy resin composition 1 can be instantaneously supplied from the composition supply container 3 into a lower molding cavity 5 by moving the shutter 4. Then, an upper substrate 7 on which a semiconductor element 6 is mounted is lowered to press the lower molding cavity 5. As the epoxy resin composition 1 is melted and the upper substrate 7 on which the semiconductor element 6 is mounted is lowered to allow the semiconductor element to be gradually dipped in the molten composition, compression molding is performed.

Figure 3:
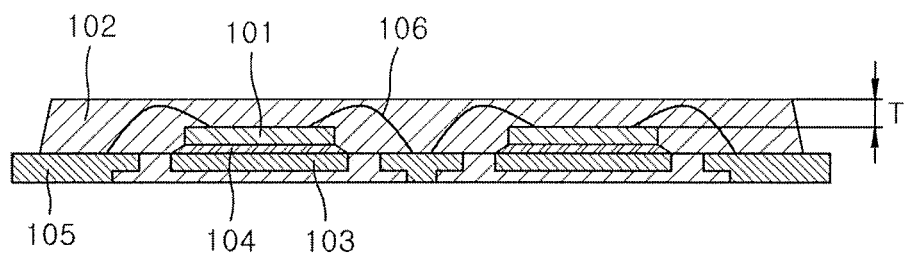
FIG. 3 is a diagram illustrating an example of a semiconductor device encapsulated by compression molding according to an example embodiment.

FIG. 3 is a diagram illustration an example of a semiconductor device encapsulated by compression molding according to an example embodiment.

Referring to FIG. 3, a semiconductor element 101 is encapsulated with an encapsulant 102 formed of an epoxy resin composition for encapsulation of semiconductor elements according to an example embodiment. The semiconductor element 101 is secured on a die pad 103 by a die bonding material 104. Electrode pads of the semiconductor element 101 are connected to lead frames 105 by wires 106. The semiconductor device according to an example embodiment is encapsulated with an encapsulant formed of the epoxy resin composition for encapsulation of semiconductor elements, and may thus exhibit a small deviation in thickness T of a semiconductor package to have a small warpage deviation.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Preparative Example: Preparation of Master Batch of Epoxy Resin Composition for Encapsulation of Semiconductor Elements A master batch composition was prepared by mixing 7.4 wt % of a phenol aralkyl type epoxy resin (NC-3000, Nippon Kayaku Co., Ltd.) and 1.8 wt % of a biphenyl type epoxy resin (YX-4000, Japan Epoxy Resin Co., Ltd.) as epoxy resins; 3.3 wt % of a phenol novolac resin (DL-92, Meiwa Co., Ltd.) and 0.8 wt % of a phenol aralkyl type phenol resin (MEH-7851S, Meiwa Co., Ltd.) as curing agents; 0.7 wt % of triphenyl phosphine (Hokko Chemical Co., Ltd.) as a curing accelerator; 85 wt % of spherical fused silica having an average particle diameter of 20 μm as an inorganic filler; 0.2 wt % of epoxy silane (KBM-303, Shin Etsu Co., Ltd.) and 0.2 wt % of amino silane (KBM-573, Shin Etsu Co., Ltd.) as coupling agents; 0.3 wt % of carbon black (MA-600B, Mitsubishi Chemical Co., Ltd.) as a colorant; and 0.3 wt % of carnauba wax as a release agent using a Henschel mixer ((KSM-22, Keun Sung Machinery Co., Ltd.). Here, 'wt %' indicates the content of each component in the epoxy resin composition for encapsulation of semiconductor elements.

Example 1

The master batch composition prepared in the Preparative Example was melt-kneaded at 90° C. to 110° C. using a continuous kneader, followed by cooling and pulverization, thereby preparing a powder composition. A tablet form of an epoxy resin composition for encapsulation of semiconductor elements was prepared from the prepared powder composition using a tablet composition molding machine.

In detail, the prepared powder composition was poured into a feeder of a tableting machine. Then, the powder composition, placed in a die, was compressed by lowering an upper punch to prepare a tablet-shaped composition, which in turn was ejected from the die by lifting the upper punch. A compression load applied to the composition by lowering the upper punch while lifting the lower punch was 0.2 ton, and the diameter and height of the die were adjusted to prepare a tablet form of an epoxy resin composition for encapsulation of semiconductor elements having properties as listed in Table 1.

Examples 2 to 7

Each of tablet forms of epoxy resin compositions for encapsulation of semiconductor elements having properties as listed in Tables 2 and 3 was prepared in the same manner as in Example 1 except for the compression load and the diameter and/or height of the die.

Comparative Examples 1 to 9 (Tablet Compression)

Each of tablet forms of epoxy resin compositions for encapsulation of semiconductor elements having properties as listed in Tables 2 and 3 was prepared in the same manner as in Example 1 except for the compression load and the diameter and/or height of the die.

Comparative Example 10 (Centrifugal Milling)

A punching iron screen having openings having a diameter of 2.5 mm was used as a material for a cylindrical outer periphery. The cylindrical outer periphery was formed by placing a cylindrical punching iron screen having a height of 25 mm and a thickness of 1.5 mm on the outer periphery of a rotor having a diameter of 20 cm. The rotor was rotated at 3,000 RPM to heat the cylindrical outer periphery to 115° C. with an excitation coil. After RPM of the rotor and the temperature of the cylindrical outer periphery were returned to normal states, a molten material obtained by melt-kneading the master match using a twin-axis extruder while degassing using a deaerator was fed at a rate of 2 kg/hr from above the rotor into the rotor through a double-pipe type cylindrical tube, and then passed through a plurality of orifices formed on the cylindrical outer periphery by centrifugal force generated upon rotation of the rotor, thereby providing a resin composition having properties as shown in Table 3 by a centrifugal milling method. Kneading of the twin-screw extruder was performed at a temperature of 90° C. to 110° C.

Comparative Example 11 (Hot Cut)

An epoxy resin composition for encapsulation of semiconductor elements was melt-kneaded in a twin-screw extruder and passed through a hole (φ2 mm) of a single-screw extruder to be cut into a cylindrical shape by a cutting blade rotated while the composition passes through the hole of the extruder, thereby providing a tablet form of the epoxy resin composition having properties as shown in Table 3 by a hot cut method. Here, the cutting blade was rotated at 80 RPM and extrusion was performed at a temperature of 70° C.

The tablet forms of epoxy resin compositions for encapsulation of semiconductor elements prepared in Examples and Comparative Examples were evaluated as to the following properties and evaluation results are shown in Tables 1, 2, and 3.

(1) Size of Tablet Form of Epoxy Resin Composition for Encapsulation of Semiconductor Elements:

A specimen was passed through sieves using sieve lattices of 0.1 mm (ASTM No. 140) and 2.8 mm (ASTM No. 7) in accordance with an ASTM standard mesh by vibrating a sieve shaker at 100 punches/min for 10 minutes. The weight of tablets filtered by a sieve having a size of 0.1 mm to less than 2.8 mm, the weight of tablets filtered by a sieve having a size of less than 0.1 mm, and the weight of tablets filtered by a sieve having a size of 2.8 mm or more were measured to calculate the content ratio (%) of the tablet form of the epoxy resin composition filtered by a sieve having a size of 0.1 mm to less than 2.8 mm.

(2) σD, σH and Equation 1:

Among the molded tablets forms of epoxy resin compositions, fifty specimens were arbitrarily selected. Among the molded tablets of the epoxy resin compositions prepared in Examples and Comparative Examples, the tablets of the epoxy resin compositions prepared by tablet compression had a cylindrical shape. The diameter and height of the tablets were measured using Vernier calipers.

Based on the measurement results, σD and σH were calculated by a statistical method and the value of Equation 1 was calculated.

σD was calculated by the statistical equation, $$\sigma D = \sqrt{\frac{(x_1-m)^2 + (x_2-m)^2 + \ldots + (x_n-m)^2}{n}},$$

wherein:
m=average value:

$$m = \frac{x_1 + x_2 + \ldots + x_n}{n},$$

$x_i$=the diameter of an $i^{th}$ tablet among 50 tablets,
i is an integer from 1 to 50, and
n=50.

σH was calculated by the statistical equation, $$\sigma H = \sqrt{\frac{(x_1-m)^2 + (x_2-m)^2 + \ldots + (x_n-m)^2}{n}},$$

wherein:
m=average value:

$$m = \frac{x_1 + x_2 + \ldots + x_n}{n},$$

$x_i$=the height of an $i^{th}$ tablet among 50 tablets,
i is an integer from 1 to 50, and
n=50.

For the epoxy resin composition prepared by the centrifugal milling method in Comparative Example 10, the longest section of each of the tablets was defined as the height thereof and the shortest section of each of the tablets was defined as the diameter thereof. When a tablet had a rounded shape, a linear distance on the tablet was measured, and σD and σH were calculated by the same method as above to calculate Equation 1.

For the epoxy resin composition prepared by the hot cut method in Comparative Example 11, the diameter and height of the tablets were measured by the method as in the centrifugal milling, and σD and σH were calculated by the same method as above to calculate Equation 1.

(3) Compression Density:

Compression density was measured with respect to tablets having a sieve size of 0.1 mm to less than 2.8 mm upon sieving with an ASTM standard sieve. Specifically, some of the tablets having a sieve size of 0.1 mm to less than 2.8 mm were weighed to obtain a specimen, the weight W of the specimen being measured on an electronic scale. With half of a 50 ml-graduated cylinder filled with water, a silicone-based surfactant (BYK-378, BYK Co., Ltd.) was added to the cylinder, followed by accurately measuring a volume V1 of the water in the cylinder. The weighed tablets are placed in the cylinder, followed by accurately measuring a changed volume V2 of the water in the cylinder. Then, the compression density (unit: g/mL) was calculated according to the following Equation 2. Here, in order to remove air from a space between the tablets, the volume was measured after shaking the graduated cylinder and the compression density was measured five times and averaged.

$$\text{Compression density} = W/(V2-V1) \qquad \text{<Equation 2>}$$

(4) Curing Density:

A disc having a size of 50 mm×3 mm (diameter×thickness) was formed using an epoxy resin composition for encapsulation of semiconductor elements through transfer molding under conditions of a mold temperature of 175±5° C., an injection pressure of 7 MPa, and a curing time of 120 seconds, followed by PMC (post-mold curing) in an oven at 175° C. for 4 hours. Then, the mass and volume of the disc were measured to calculate the ratio of mass to volume (mass/volume) of the disc.

(5) Degree of Equipment Contamination Due to Scattering of Fine Particles Upon Compression Molding:

Compression molding equipment (PMC-1040, TOWA Co., Ltd.) was used as a compression molding apparatus. 25 g of each of the epoxy resin compositions prepared in the Examples and Comparative Examples was placed in a vibration feeder and a feeding operation at a rate of 1.0 g/sec was repeated 20 times. After completion of feeding, the vibration feeder was separated and the weight of each epoxy resin composition stuck to the wall of the vibration feeder was measured.

If the weight of the epoxy resin composition stuck to the wall of the vibration feeder was less than 150 mg and the epoxy resin composition stuck to an inner pipe of the vibration feeder was not observed by the naked eye, the epoxy resin composition was evaluated as X.

If the weight of the epoxy resin composition stuck to the wall of the vibration feeder was less than 150 mg and the epoxy resin composition stuck to the inner pipe thereof was observed by the naked eye, the epoxy resin composition was evaluated as Δ.

If the weight of the epoxy resin composition stuck to the wall of the vibration feeder was 150 mg or more and the inner pipe of the vibration feeder had a dark color indicating significant sticking of the epoxy resin composition, as observed by the naked eye, the epoxy resin composition was evaluated as ○.

Figure 4:
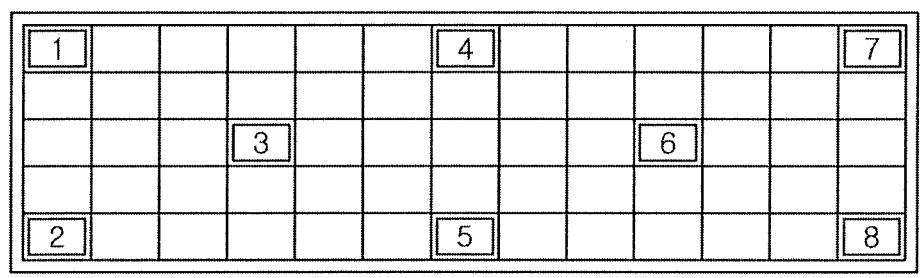
FIG. 4 is a plan view of a specimen used in measurement of thickness deviation of a semiconductor package.

(6) Thickness Deviation of Semiconductor Package:

Compression molding equipment (PMC-1040, TOWA Co., Ltd.) was used as a compression molding apparatus. 10 frames were obtained by placing 25 g of the prepared epoxy resin composition in a lower molding cavity by the method as in (5), followed by molding to have a molding thickness of 0.7 mm. As shown in FIG. 4, thicknesses of 8 zones of each of the frames were measured using Vernier calipers to calculate a thickness deviation of a package. The thickness deviation of the package was calculated by averaging a difference between the maximum value and the minimum value among the molding thicknesses.

(7) Warpage Deviation:

Die chips (8 mm×8 mm×0.08 mm (length×width×thickness)) were mounted in two layers on a printed wire substrate (substrate size: 240 mm×77.5 mm (length×width), unit size: 10 mm×10 mm (length×width)). Compression molding equipment (PMC-1040, TOWA Co., Ltd.) was used. With each of the epoxy resin compositions prepared in the Examples and Comparative Examples supplied in the same amount to the molding equipment, a semiconductor device was molded so as to have a molding thickness of 0.3 mm under conditions of a molding temperature of 175° C., a curing time of 100 seconds, and a molding pressure of 10 ton, followed by a PMC (post-mold curing) process at 175° C. for 4 hours. With respect to an arbitrarily selected 10 units, warpage values at 25° C. were measured using a warpage measurement device (Akrometrix, AXP) to obtain a deviation. The deviation was defined by a difference between the maximum value and the minimum value among the warpage values.

(8) Wire Sweep:

A die chip (10 mm×10 mm×0.5 mm (length×width×thickness)) was mounted on a printed wire substrate (substrate size: 240 mm×77.5 mm (length×width), unit size: 10 mm×10 mm (length×width)). A gold wire having a diameter of 0.8 mm was used for connection. Compression molding equipment (PMC-1040, TOWA Co., Ltd.) was used. With each of the epoxy resin compositions prepared in the Examples and Comparative Examples supplied in the same amount to the mold equipment, a semiconductor device was molded so as to have a molding thickness of 0.7 mm under conditions of a molding temperature of 175° C., a curing time of 100 seconds, and a molding pressure of 10 ton. Wire sweep was evaluated with respect to 10 wires (having a length of 3 mm) of the package using X-ray transmission equipment (Toshiba, Tosmicron-S4090).

TABLE 1

| | Item | Ex. 1 | Ex. 2 | Ex. 3 | Ex. 4 | Ex. 5 | Ex. 6 | Ex. 7 |
|---|---|---|---|---|---|---|---|---|
| Manufacturing conditions | Manufacturing method | Tablet compression | Tablet compression | Tablet compression | Tablet compression | Tablet compression | Tablet compression | Tablet compression |
| | Compression load (ton) | 0.2 | 0.6 | 0.4 | 0.4 | 0.3 | 0.3 | 0.6 |
| Size | Content of tablets having a size of 0.1 mm to less than 2.8 mm (wt %) | 98.2 | 98.3 | 98.3 | 97.2 | 97.1 | 97.5 | 97.8 |
| | Average diameter (mm) | 1.20 | 1.12 | 1.11 | 1.72 | 1.70 | 1.49 | 1.2 |
| | Average height (mm) | 0.52 | 1.59 | 2.55 | 1.67 | 1.65 | 2.20 | 1.28 |
| | Standard deviation $\sigma D$ | 0.5 | 0.1 | 0.1 | 1.9 | 1.8 | 1.5 | 0.5 |
| | $\sigma H$ | 0.1 | 0.1 | 0.1 | 1.9 | 1.8 | 2.2 | 0.1 |
| | Equation 1 | 0.1 | 0.05 | 0.05 | 0.95 | 0.9 | 0.9 | 0.1 |
| Compression density (g/mL) | | 1.2 | 1.7 | 1.5 | 1.53 | 1.25 | 1.6 | 1.7 |
| Curing density (g/mL) | | 1.98 | 1.99 | 1.98 | 1.97 | 1.97 | 1.98 | 1.97 |
| Density ratio (compression density/curing density) | | 0.61 | 0.85 | 0.76 | 0.78 | 0.64 | 0.81 | 0.86 |
| Shape | | Cylindrical shape | Cylindrical shape | Cylindrical shape | Cylindrical shape | Cylindrical shape | Cylindrical shape | Cylindrical shape |
| Degree of equipment contamination due to scattering of fine particles upon compression molding | | x | x | x | x | x | Δ | x |
| Thickness deviation of semiconductor package (μm) | | 1.4 | 2.2 | 1.9 | 8.4 | 5.6 | 8.6 | 8.4 |
| Warpage deviation (μm) | | 2.5 | 3.5 | 2.8 | 9.7 | 7.2 | 9.8 | 9.4 |
| Wire sweep (%) | | 1.3 | 7.2 | 1.3 | 6.4 | 5.1 | 7.6 | 8.9 |

TABLE 2

| | Item | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|
| Manufacturing conditions | Manufacturing method | Tablet compression | Tablet compression | Tablet compression | Tablet compression | Tablet compression | Tablet compression | Tablet compression |
| | Compression load (ton) | 0.4 | 0.8 | 0.1 | 0.4 | 1.3 | 1.0 | 0.9 |
| Size | Content of tablets having a size of 0.1 mm to less than 2.8 mm (wt %) | 32.4 | 99.1 | 35.2 | 97.2 | 98.5 | 18.2 | 22.3 |
| | Average diameter (mm) | 3.00 | 1.00 | 3.03 | 0.69 | 0.72 | 2.93 | 3.20 |
| | Average height (mm) | 2.90 | 2.50 | 2.87 | 0.71 | 0.74 | 3.02 | 3.77 |
| | Standard deviation $\sigma D$ | 3.1 | 0.1 | 1.3 | 2.2 | 2.3 | 1.3 | 2.2 |
| | $\sigma H$ | 3.2 | 0.5 | 1.3 | 2.3 | 2.4 | 0.8 | 3.1 |
| | Equation 1 | 1.6 | 0.1 | 0.6 | 1.1 | 1.2 | 0.5 | 1.3 |
| Compression density (g/mL) | | 1.51 | 1.8 | 1.1 | 1.52 | 1.9 | 1.92 | 1.9 |
| Curing density (g/mL) | | 1.98 | 1.98 | 1.97 | 1.98 | 1.99 | 1.99 | 1.98 |
| Density ratio (compression density/curing density) | | 0.76 | 0.91 | 0.56 | 0.77 | 0.95 | 0.96 | 0.96 |

TABLE 2-continued

| Item | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|
| Shape | Cylindrical shape | Cylindrical shape | Cylindrical shape | Cylindrical shape | Cylindrical shape | Cylindrical shape | Cylindrical shape |
| Degree of equipment contamination due to scattering of fine particles upon compression molding | x | x | ○ | x | x | x | x |
| Thickness deviation of semiconductor package (μm) | 15.7 | 13.4 | 13.2 | 14.2 | 14.7 | 12.3 | 16.4 |
| Warpage deviation (μm) | 20.5 | 19.8 | 24.2 | 22.4 | 25.7 | 22.32 | 29.2 |
| Wire sweep (%) | 22.4 | 16.4 | 12.8 | 28.4 | 33.2 | 39.2 | 42.4 |

TABLE 3

| | Item | Comp. Ex. 8 | Comp. Ex. 9 | Comp. Ex. 10 | Comp. Ex. 11 |
|---|---|---|---|---|---|
| Manufacturing conditions | Manufacturing method | Tablet compression | Tablet compression | Centrifugal milling | Hot cut |
| | Compression load (ton) | 0.2 | 0.1 | — | — |
| Size | Content of tablets having a size of 0.1 mm to less than 2.8 mm (wt %) | 96 | 99.1 | 38.2 | 47.2 |
| | Average diameter (mm) | 1.1 | 1.3 | 1.82 | 2.48 |
| | Average height (mm) | 2.6 | 1.8 | 2.53 | 2.26 |
| | Standard deviation σD | 0.2 | 0.1 | 2.1 | 2.1 |
| | Standard deviation σH | 0.2 | 0.5 | 2.6 | 2.3 |
| | Equation 1 | 0.1 | 0.1 | 2.6 | 1.1 |
| Compression density (g/mL) | | 1.5 | 1.1 | 1.87 | 1.9 |
| Curing density (g/mL) | | 1.98 | 1.98 | 1.98 | 1.98 |
| Density ratio (compression density/curing density) | | 0.76 | 0.56 | 0.94 | 0.96 |
| Shape | | Cylindrical shape | Cylindrical shape | Oval shape | Cylindrical shape |
| Degree of equipment contamination due to scattering of fine particles upon compression molding | | ○ | ○ | Δ | Δ |
| Thickness deviation of semiconductor package (μm) | | 2.0 | 1.4 | 13.9 | 14.8 |
| Warpage deviation (μm) | | 3.1 | 2.3 | 23.5 | 35.2 |
| Wire sweep (%) | | 1.9 | 1.5 | 12.2 | 29.4 |

As shown in Table 1, the tablet forms of the epoxy resin compositions according to Examples 1-7 provided a small thickness deviation of a semiconductor package while reducing semiconductor warpage deviation upon encapsulation of semiconductor elements by compression molding, and could reduce equipment contamination by preventing the composition from sticking to the compression molding equipment and/or from scattering therein upon encapsulation of semiconductor elements by compression molding. Furthermore, the tablet forms of the epoxy resin compositions according to Examples 1-7 could significantly reduce wire sweep upon encapsulation of semiconductor elements by compression molding.

Regarding the Comparative Examples, as shown in Tables 2 and 3, each of the tablet forms of the epoxy resin compositions of Comparative Examples 10 and 11 (respectively prepared by the centrifugal milling method and the hot cut method) did not satisfy conditions (i), (ii), and (iii) described above, and exhibited poor characteristics in terms of thickness deviation of a semiconductor package and semiconductor warpage deviation.

In addition, even by the tablet compression molding method, the tablet forms of the epoxy resin compositions of Comparative Examples 1 to 9 exhibited insignificant effects in reduction of thickness deviation of a semiconductor package, semiconductor warpage deviation and wire sweep when all of conditions (i), (ii), and (iii) were not satisfied.

By way of summation and review, a semiconductor device may be manufactured by encapsulating semiconductor elements through compression molding in order to realize a high-performance, multifunctional, slimmer mobile device and to develop a thinner and highly integrated semiconductor device.

Compression molding may reduce wire sweep by limiting the flow of a resin in a composition, as compared to transfer molding. In addition, semiconductor elements may be molded by compression in a mold to suppress generation of voids even when the semiconductor elements are stacked in a multilayer stack.

In compression molding, an epoxy resin composition for encapsulation of semiconductor elements may be supplied in a film or sheet shape into a mold, or the epoxy resin composition may be supplied in a granular shape into a lower molding cavity in consideration of moldability and movability of the resin composition.

In compression molding, a plurality of semiconductor elements may be arranged and encapsulated at the same time by compression molding. However, thickness deviation of a semiconductor package may occur depending upon the epoxy resin composition for encapsulation of semiconductor elements, an issue that may be accentuated with decreasing thickness of the semiconductor package. Significant thickness deviation of the semiconductor package may result in deviation in semiconductor warpage and failure of the semiconductor package.

In general, an epoxy resin composition for encapsulation of semiconductor elements may be prepared by a centrifugal milling method, a hot cut method, and the like, but an epoxy resin prepared by these methods may be limited in relation to reducing thickness deviation of a semiconductor package or warpage deviation upon compression molding.

As described above, embodiments may provide a tablet form of an epoxy resin composition for encapsulation of semiconductor elements, which can reduce thickness deviation of a semiconductor package and semiconductor warpage deviation upon encapsulation of a semiconductor element by compression molding.

As described above, embodiments may provide a tablet-type epoxy resin composition for sealing a semiconductor device and a semiconductor device sealed using the same, where, with respect to an entire tablet-type epoxy resin composition for sealing a semiconductor device: (i) the ratio of a tablet having a diameter greater than or equal to 0.1 mm and less than 2.8 mm and a height greater than or equal to 0.1 mm and less than 2.8 mm is 97 wt % or more when measurement is performed by sieving using an ASTM standard sieve; (ii) formula 1 is met when the standard deviation of the diameter is designated as σD and the standard deviation of the height is designated as σH after the diameter and the height of 50 tablets among the tablets are respectively measured; and (iii) the tablet has a compression density of 1.2-1.7 g/mL.

Embodiments may provide a tablet form of an epoxy resin composition for encapsulation of semiconductor elements, which can suppress contamination of compression molding equipment by preventing the resin composition from sticking to and/or scattering in the compression molding equipment upon encapsulation of a semiconductor element by compression molding.

Embodiments may provide a tablet form of an epoxy resin composition for encapsulation of semiconductor elements, which can significantly reduce wire sweep upon encapsulation of the semiconductor elements by compression molding.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A tablet form of an epoxy resin composition for encapsulation of semiconductor elements,
    wherein the tablet form of the epoxy resin composition
    (i) includes 97 wt % or more of tablets having a diameter of 0.1 mm to less than 2.8 mm and a height of 0.1 mm to less than 2.8 mm, as measured using an ASTM standard sieve,
    (ii) satisfies the following Equation 1:

$$\frac{\sigma D \times \sigma H}{\sigma D + \sigma H} \leq 1.0 \tag{1}$$

where σD is a standard deviation of tablet diameters and σH is a standard deviation of tablet heights, as measured with respect to 50 tablets arbitrarily selected from the tablets; and
    (iii) the tablets have a compression density of 1.2 g/mL to 1.7 g/mL.

2. The tablet form of the epoxy resin composition as claimed in claim 1, wherein the tablets have a cylindrical shape.

3. The tablet form of the epoxy resin composition as claimed in claim 1, wherein, in (ii), each of σD and σH is 2.0 or less.

4. The tablet form of the epoxy resin composition as claimed in claim 1, wherein, in (ii), each of σD and σH is less than 1.0.

5. The tablet form of the epoxy resin composition as claimed in claim 1, wherein, in (ii), the tablets have an aspect ratio of 0.1 to 5.0.

6. The tablet form of the epoxy resin composition as claimed in claim 1, wherein the tablet form of the epoxy resin composition is prepared by tablet compression molding.

7. The tablet form of the epoxy resin composition as claimed in claim 1, wherein the tablet form of the epoxy resin composition has a density ratio of compression density to curing density (compression density/curing density) in the range of 0.6 to 0.87.

8. A semiconductor device encapsulated with the tablet form of the epoxy resin composition for encapsulation of semiconductor elements as claimed in claim 1.

9. A method of preparing a tableted epoxy resin composition, the method comprising:
    providing an epoxy resin master batch that includes 0.5 wt % to 20 wt % of an epoxy resin, 0.1 wt % to 13 wt % of a curing agent, 70 wt % to 95 wt % of an inorganic filler, and 0.01 wt % to 2 wt % of a curing accelerator, all wt % being based on a total weight of the master batch;
    preparing a powder composition from the master batch; and
    tableting the powder composition by compressing the powder composition in a die using a compression load in a range of 0.1 ton to 1.0 ton, the die having a diameter of 0.1 mm to less than 2.8 mm and a height of 0.1 mm to less than 2.8 mm.

10. A tablet form epoxy resin composition prepared according to the method as claimed in claim 9.

11. A semiconductor device encapsulated with the tablet form of the epoxy resin composition for encapsulation of semiconductor elements as claimed in claim 10.

* * * * *